(12) United States Patent
Yamanoi et al.

(10) Patent No.: US 10,615,314 B2
(45) Date of Patent: Apr. 7, 2020

(54) LIGHT-EMITTING DEVICE

(71) Applicant: NICHIA CORPORATION, Anan-shi (JP)

(72) Inventors: Takuya Yamanoi, Komatsushima (JP); Nobuhiro Ubahara, Anan (JP); Hiroaki Matsumura, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/475,160

(22) Filed: Mar. 31, 2017

(65) Prior Publication Data

US 2017/0288096 A1    Oct. 5, 2017

(30) Foreign Application Priority Data

Mar. 31, 2016 (JP) ................................. 2016-071468
Dec. 27, 2016 (JP) ................................. 2016-252373

(51) Int. Cl.
*H01L 33/60* (2010.01)
*H01L 33/48* (2010.01)

(52) U.S. Cl.
CPC ............ *H01L 33/486* (2013.01); *H01L 33/60* (2013.01)

(58) Field of Classification Search
CPC .............................. H01L 33/60; H01L 33/468
See application file for complete search history.

(56) References Cited

U.S. PATENT DOCUMENTS

| 9,324,702 | B2 | 4/2016 | Lin et al. | |
| 2004/0201987 | A1 | 10/2004 | Omata | |
| 2009/0026485 | A1* | 1/2009 | Urano | H01L 33/483 257/99 |
| 2009/0219728 | A1 | 9/2009 | Hata et al. | |
| 2009/0294940 | A1 | 12/2009 | Sugimoto et al. | |
| 2012/0286319 | A1* | 11/2012 | Lee | H01L 33/642 257/99 |
| 2014/0111947 | A1* | 4/2014 | Henniger | H01L 23/055 361/728 |

(Continued)

FOREIGN PATENT DOCUMENTS

| JP | 2004-327564 | 11/2004 |
| JP | 2004-327955 | 11/2004 |

(Continued)

*Primary Examiner* — Trang Q Tran
(74) *Attorney, Agent, or Firm* — Mori & Ward, LLP

(57) ABSTRACT

A light-emitting device includes a substrate including a substrate second upper surface provided between a substrate bottom surface and a substrate first upper surface in a height direction. A light-emitting element to emit ultraviolet light is provided on the substrate first upper surface. A protective element includes a protective element upper surface provided between the substrate first upper surface and the substrate second upper surface in the height direction. A frame is bonded to the substrate first upper surface via adhesive members to surround the light-emitting element. The frame includes a frame lower surface opposite to the substrate first upper surface and the substrate second upper surface in the height direction to provide a gap between the substrate first upper surface and the frame lower surface. A space in which the light-emitting element is provided communicates with an outside of the light-emitting device via the gap.

10 Claims, 8 Drawing Sheets

(56) References Cited

U.S. PATENT DOCUMENTS

2017/0263833 A1* 9/2017 Chiu .................. H01L 33/62
2017/0279019 A1   9/2017 Ueda et al.

FOREIGN PATENT DOCUMENTS

| JP | 2007-150229 | 6/2007 |
| JP | 2007-281061 | 10/2007 |
| JP | 2009-049172 | 3/2009 |
| JP | 2009-289930 | 12/2009 |
| JP | 2010-028049 | 2/2010 |
| JP | 2011-243647 | 12/2011 |
| JP | 2014-123598 | 7/2014 |
| JP | 2015-122485 | 7/2015 |
| JP | 5877487 B1 | 3/2016 |

* cited by examiner

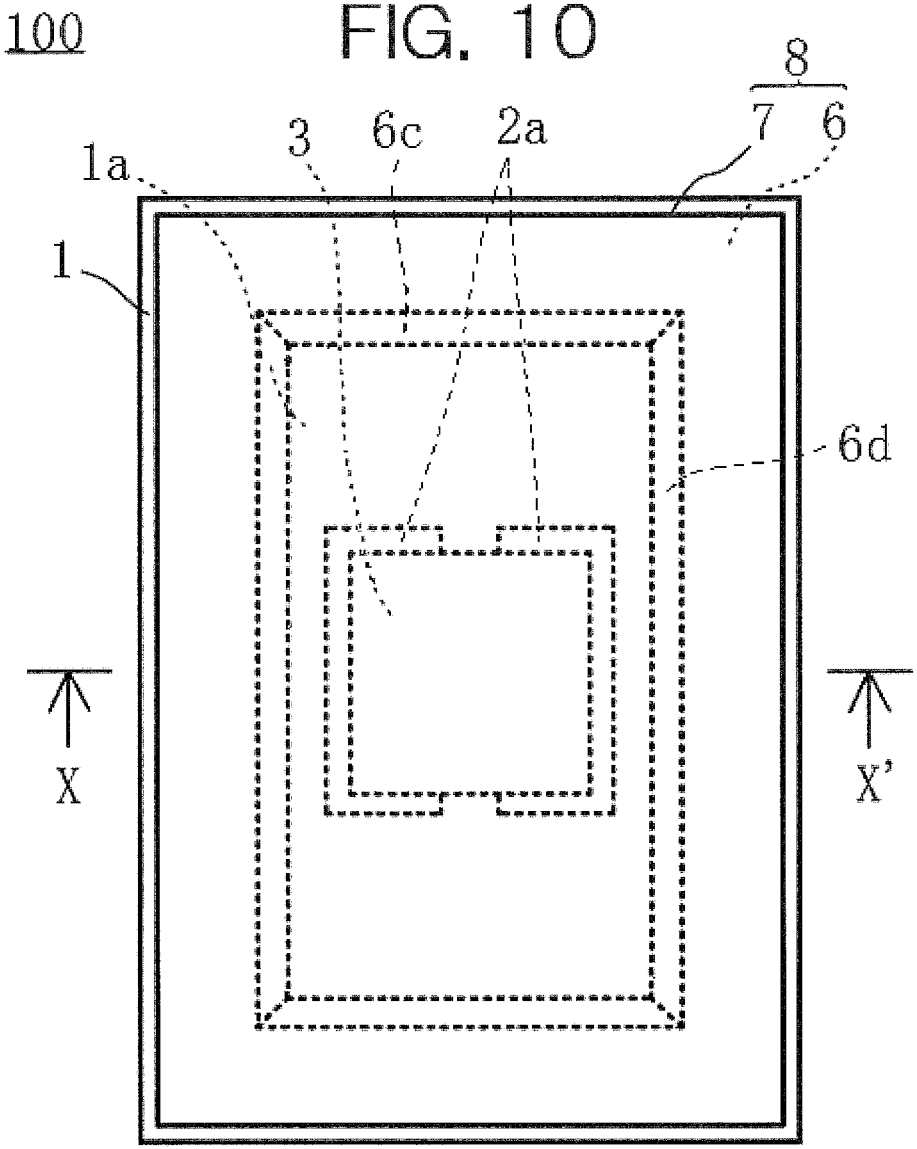

LIGHT-EMITTING DEVICE

CROSS-REFERENCE TO RELATED APPLICATIONS

The present application claims priority under 35 U.S.C. § 119 to Japanese Patent Application No. 2016-71468, filed Mar. 31, 2016, and Japanese Patent Application No. 2016-252373, filed Dec. 27, 2016. The contents of these applications are incorporated herein by reference in their entirety.

BACKGROUND OF THE INVENTION

Field of the Invention

The present disclosure relates to a light-emitting device.

Discussion of the Background

Light emitting diodes (LEDs) configured to emit light having wavelengths in the ultraviolet region (hereinafter referred to as "ultraviolet light") are often used in recent years. Such LEDs are used for, for example, light sources for printing, curing, or sterilization.

Japanese Unexamined Patent Application Publication No. 2015-122485 discloses a light-source unit including a substrate, LED elements that are disposed on the substrate and configured to emit ultraviolet light, a connector, a light-shielding window holder frame that surround the LED elements and the connector, and a window member on the window holder frame. The light-source unit disclosed in Japanese Unexamined Patent Application Publication No. 2015-122485 further include a light-shielding member between the LED elements and the connector. With such constitutions, the light-shielding member block ultraviolet light emitted from the LED elements, and the connector is not easily be irradiated with the ultraviolet light. Thus, deterioration of the connectors due to the ultraviolet light from the LED elements can be reduced (see FIG. 1 in Japanese Unexamined Patent Application Publication No. 2015-122485).

SUMMARY OF THE INVENTION

A light-emitting device according to an embodiment of the present invention includes a substrate, a light-emitting element, a protective element, adhesive members, a frame, and a light-transmissive member. The substrate includes a substrate bottom surface, a substrate first upper surface and a substrate second upper surface. The substrate first upper surface is opposite to the substrate bottom surface in a height direction of the light-emitting device. The substrate second upper surface is opposite to the substrate bottom surface in the height direction. The substrate second upper surface is provided between the substrate first upper surface and the substrate bottom surface in the height direction. The light-emitting element is to emit ultraviolet light. The light-emitting element is provided on the substrate first upper surface. The protective element is provided on the substrate second upper surface. The protective element includes a protective element lower surface and a protective element upper surface. The protective element lower surface faces the substrate second upper surface. The protective element upper surface is opposite to the protective element lower surface in the height direction. The protective element upper surface is provided between the substrate first upper surface and the substrate second upper surface in the height direction. The adhesive members are provided on the substrate first upper surface to surround the light-emitting element. The frame is bonded to the substrate first upper surface via the adhesive members to surround the light-emitting element. The frame includes a frame lower surface and a frame upper surface. The frame lower surface is opposite to the substrate first upper surface and the substrate second upper surface in the height direction to provide a gap between the substrate first upper surface and the frame lower surface. A space in which the light-emitting element is provided communicates with an outside of the light-emitting device via the gap. The frame upper surface is opposite to the frame lower surface in the height direction. The light-transmissive member is provided on the frame upper surface.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

FIG. 10 is a schematic plan view of a variant example of the light-emitting device.

DETAILED DESCRIPTION OF EMBODIMENTS

Figure 1:
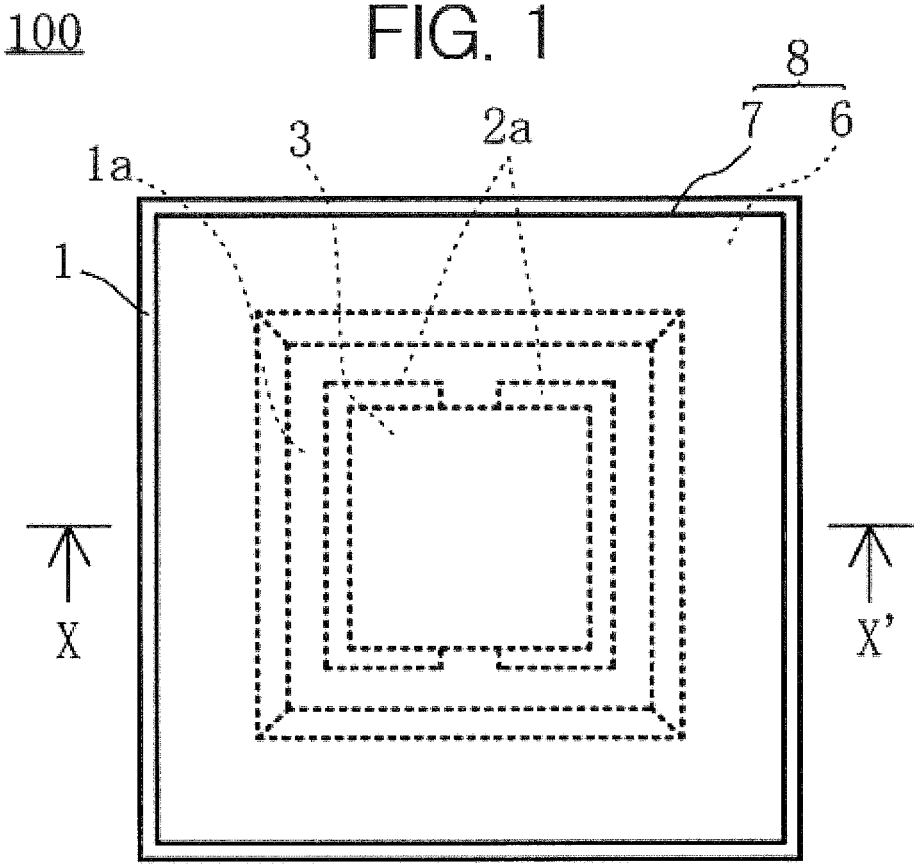
FIG. 1 is a schematic plan view of a light-emitting device according to a first embodiment of the present invention.

The embodiments will now be described with reference to the accompanying drawings, wherein like reference numerals designate corresponding or identical elements throughout the various drawings.

The following describes embodiments and an example of the present invention referring to the accompanying drawings as appropriate. Descriptions in the embodiments and the example in the below are intended to embody the technical concept of the present invention and are not limited to the constitutions below. In particular, unless specifically stated otherwise, the dimensions, materials, shapes, and relative positions of constituent components do not limit the scope of the present invention thereto. It is noted that magnitudes or positional relations of members illustrated in each drawing may be exaggerated in order to clarify the descriptions. Configurations in the embodiments and the example to be described below can be applied in combination as appropriate.

First Embodiment

Figure 2:
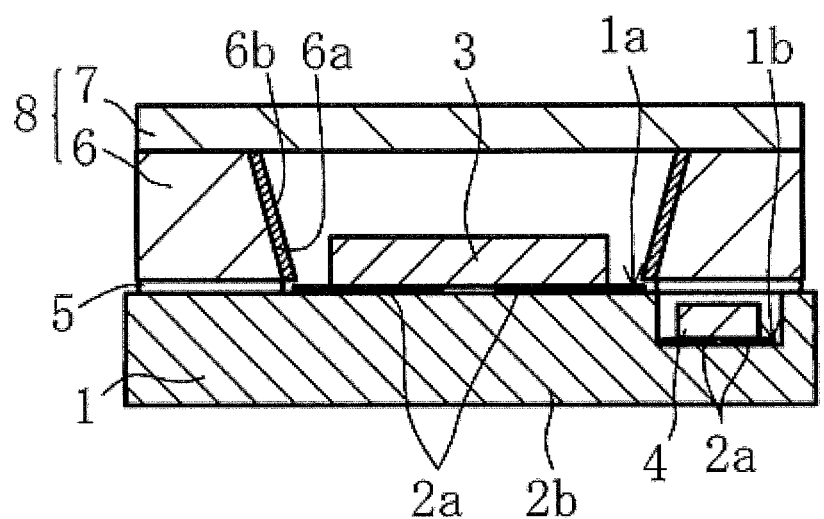
FIG. 2 is a schematic cross-sectional view of the light-emitting device in FIG. 1 taken along the line X-X'.
Figure 3:
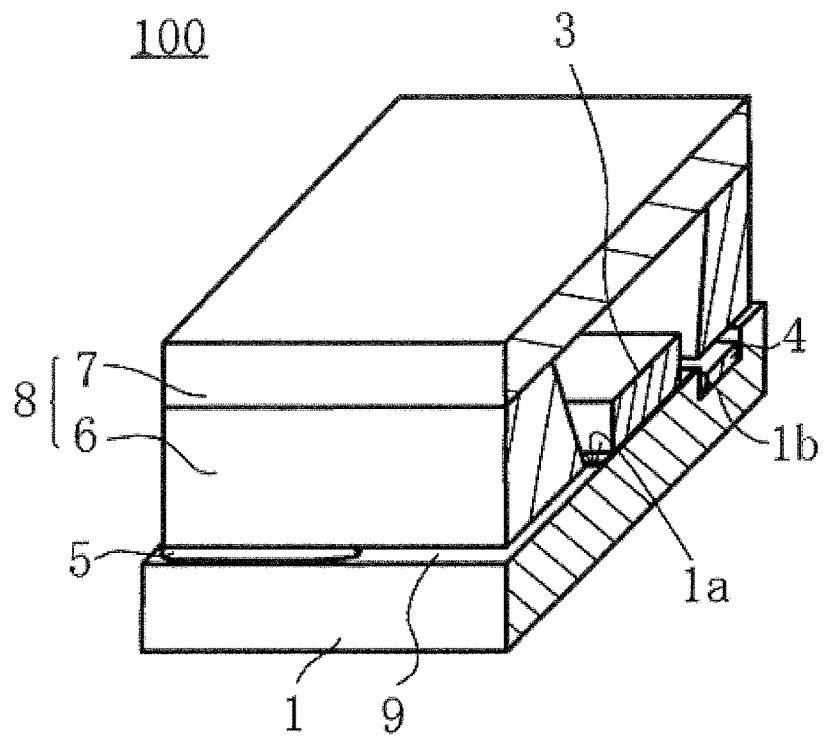
FIG. 3 is a schematic perspective, cross-sectional view of the light-emitting device according to the first embodiment of the present invention.
Figure 4:
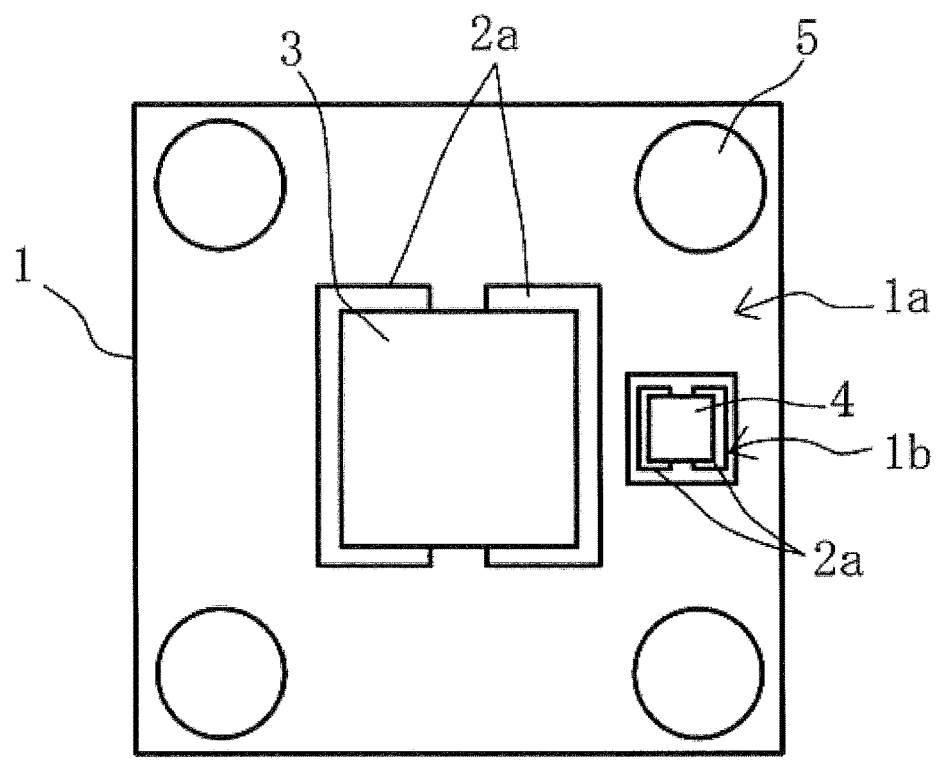
FIG. 4 is a schematic plan view of a substrate on which a light-emitting element, a protective element, and adhesive members are disposed and that is used in the light-emitting device in FIG. 1, showing the light-emitting device in a state before a cap including a frame and a light-transmissive member is bonded to the substrate.
Figure 7:
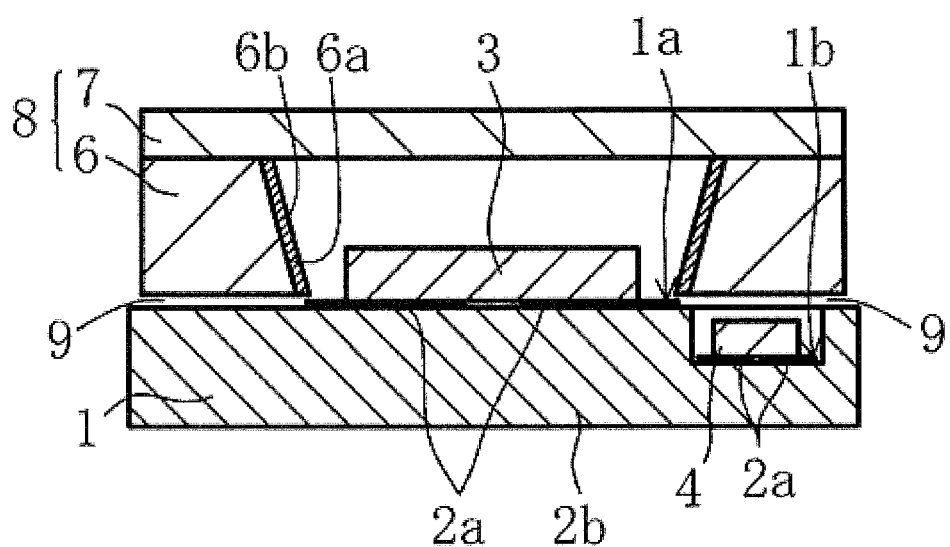
FIG. 7 is a schematic sectional end view of the light-emitting device in FIG. 1 taken along the line X-X'.

To prevent decrease in light extraction due to the black deposits as described above, it is important for a light-emitting device to have a configuration that allows sufficient oxygen to be supplied into a space for mounting a light-emitting element, that is, to have a configuration that allows a flow of air between the space for mounting the light-emitting element and the outside of the light-emitting device to be smooth. Configurations of a light-emitting device 100 according to the present embodiment are described below.
Light-Emitting Device FIG. 1 is a schematic plan view of the light-emitting device 100 according to a first embodiment of the present invention. FIG. 2 is a schematic cross-sectional view of the light-emitting device 100 in FIG. 1 taken along the line X-X'. FIG. 3 is a schematic perspective, cross-sectional view of the light-emitting device 100 according to the first embodiment of the present invention. FIG. 4 is a schematic plan view of a substrate 1 on which a light-emitting element 3, a protective element 4, and adhesive members 5 are disposed and that is used for the light-emitting device 100, showing the light-emitting device 100 in a state before a cap 8 including a frame 6 and a light-transmissive member 7 is bonded to the substrate. FIG. 7 is a schematic sectional end view of the light-emitting device 100 in FIG. 1 taken along the line X-X'. FIG. 10 is a schematic plan view of a variant example of the light-emitting device 100. In the present specification, the up-down direction in each cross-sectional view or each end view may be referred to as a "height direction", and the right-left direction in each cross-sectional view, that is, a direction perpendicular to the height direction may be referred to as a "width direction".

As shown in FIG. 1 to FIG. 4, the light-emitting device 100 according the first embodiment includes a substrate 1 having a first upper surface (a substrate first upper surface) 1a and a second upper surface (a substrate second upper surface) 1b located lower than the first upper surface 1a, the light-emitting element 3 that is mounted on the first upper surface 1a and configured to emit ultraviolet light, and a protective element 4 that is mounted on the second upper surface 1b and has an upper surface (a protective element upper surface) located at the same height as or lower than the first upper surface 1a. In the first embodiment, as shown in FIG. 2 and FIG. 3, the substrate 1 has a shape of a flat plate having an upper surface in which a recess is defined. The first upper surface 1a is a portion of the upper surface other than the recess, and the second upper surface 1b serves as the bottom surface of the recess. The light-emitting element 3 is mounted approximately on the same surface of the substrate 1 on which the frame 6 of the cap 8 is bonded, which allows the distance between the light-emitting element 3 and a gap 9 between the substrate 1 and the cap 8 to be relatively small as shown in FIG. 3 and FIG. 7. The light-emitting device 100 can thus have a structure that allows outside air to be easily supplied to the light-emitting element 3. Further, with the first upper surface 1a located highest in the upper surface of the substrate 1, a flow of air between the light-emitting element 3 and the frame 6 are not easily blocked. The substrate 1 in the first embodiment has a rectangular shape in a plan view as shown in FIG. 4, but may alternatively have any appropriate shape. For example, a polygonal shape such as a triangular shape or a hexagonal shape, a circular shape, or an elliptic shape in a plan view may be employed.

Positive and negative wirings 2a are disposed on each of the first upper surface 1a and the second upper surface 1b of the substrate 1. The positive and negative wirings 2a each have an approximately rectangular shape in FIG. 1 and FIG. 4, but may each have a desired pattern as appropriate. For example, each of the positive and negative wirings may have a semicircular shape so that the outer periphery of each of the positive and negative wirings has an approximately circular shape or an approximately ellipse shape. With this arrangement, the light-emitting device 100 with high reliability in which uniform diffusion of heat from the light-emitting element 3 to the substrate 1 is facilitated.

In the first embodiment, the light-emitting element 3 and the protective element 4 are flip-chip mounted on the substrate 1. More specifically, the light-emitting element 3 including positive and negative electrodes on the same surface side is used, and each of the positive and negative electrodes of the light-emitting element 3 is electrically connected to the corresponding one of positive and negative wirings 2a on the first upper surface 1a of the substrate 1 via an electrically-conductive adhesive. In addition, the protective element 4 in which positive and negative electrodes are disposed on the same surface side is used, and each of the positive and negative electrodes of the protective element 4 is electrically connected to the corresponding one of positive and negative wirings 2a on the second upper surface 1b of the substrate 1 via an electrically-conductive adhesive. The protective element 4 is mounted on the second upper surface 1b so that the upper surface of the protective element 4 is located at the same height as or lower than the first upper surface 1a.

In the first embodiment, the adhesive members 5 for bonding the cap 8 are disposed on a portion of the first upper surface 1a on the outer side of the light-emitting element 3, as shown in FIG. 4. A plurality of adhesive members 5 are disposed on portions of the region of the first upper surface 1a on which the cap 8 is to be mounted. The cap 8 is mounted to surround the light-emitting element 3, and accordingly it is preferable that the adhesive members 5 also surround the light-emitting element 3. In the first embodiment, arrangement of these adhesive members 5 provides the gap 9 between the first upper surface 1a of the substrate 1 and the lower surface (a frame lower surface) of the cap 8, as shown in FIG. 3. That is, a gap having a desired width in the height direction can be formed by adjusting the thickness, the quantity, the viscosity, and the like of the adhesive members 5 as appropriate. The size of the gap 9 in the height direction is preferably selected to be in the range that allows for barely blocking the flow of air between the outside of the light-emitting device 100 and a space defined by the substrate 1 and the cap 8 in which the light-emitting element 3 is mounted (hereinafter may be referred to as the "space for mounting the light-emitting element 3"), and allows for preventing an adhesive member, flux, and the like from entering into the space for mounting the light-emitting element 3 during mounting of the light-emitting device 100 on a mounting board. In view of the above, for example, the size of the gap 9 in the height direction is preferably selected to be in the range of 10 µm to 50 µM.

Further, the plurality of adhesive members 5 are separated from one another in a plan view, so that the gap 9 can be formed penetrating from the space for mounting the light-emitting element 3 to the outside of the light-emitting device 100, as shown in FIG. 3. Such an arrangement allows movement of air between the space for mounting the light-emitting element 3 and the outside of the light-emitting device 100 to be smooth, compared with, for example, the case where an adhesive member 5 is disposed integrally along the outer periphery of the substrate 1 in a plan view. Thus, adhesion of a deposit to a surface of the light-emitting element 3 during operation of the light-emitting device 100 can be prevented, compared with the case where the adhesive material 5 is integrally disposed at a position at which the frame 6 is to be mounted.

In the first embodiment, the adhesive members 5 are disposed at four positions on the corners of the first upper surface 1a of the substrate 1 that has a rectangular shape in a plan view so that the adhesive members 5 surround the light-emitting element 3, as shown in FIG. 4. With the arrangement of the adhesive members 5 that is substantially point-symmetric or line-symmetric about the center of the substrate 1 in a plan view as described above, bondability between the substrate 1 and the cap 8 can be further increased. In addition, with the adhesive members 5 disposed in a region with an area of 4% to 20% of that of the region on which the cap 8 is to be mounted, a sufficient gap penetrating from the space for mounting the light-emitting element 3 to the outside of the light-emitting device 100 can be secured while maintaining the bondability between the substrate 1 and the cap 8.

The number, the location, the disposing region, the viscosity, the quantity, the thickness, and the like of the adhesive members 5 may be appropriately selected so that the cap 8 can be bonded to the substrate 1 and so that a sufficient gap penetrating from the space for mounting the light-emitting element 3 to the outside of the light-emitting device 100 can be ensured when the cap 8 is bonded to the substrate 1.

In the first embodiment, the recess in the second upper surface 1b of the substrate 1 in which the protective element 4 is to be mounted is a void, as shown in FIG. 2 and FIG. 3. With the recess of a void, the flow of air between the space for mounting the light-emitting element 3 and the outside tends to be smooth, and thus is preferable. A covering member for covering the protective element 4 may be disposed in the recess. The covering member is disposed such that the upper surface of the protective element 4 is located at a height that is the same as or lower than a height of the first upper surface 1a of the substrate 1. Arrangement of the covering member allows for disposing the adhesive members 5 on the covering member and facilitating the bonding of the cap 8. Arrangement of a light-reflective covering member allows for reducing absorption of light from the light-emitting device 3 by the protective element 4.

In the first embodiment, the cap 8 is connected via the adhesive members 5 to the first upper surface 1a of the substrate 1 on which the light-emitting element 3 and the protective element 4 are mounted, as described above. The cap 8 surrounds the light-emitting element 3 and the protective element 4 as well as the substrate 1 to function as a member protecting from dust and external force and from an adhesive and flux at the time of mounting the light-emitting device 100 on the mounting board. The cap 8 includes the light-transmissive member 7 at least above the light-emitting element 3 so that light from the light-emitting element 3 can be emitted to the outside.

The cap 8 in the first embodiment includes the light-shielding frame 6 bonded to the first upper surface 1a via the adhesive members 5, and the light-transmissive member 7 bonded to the upper surface (a frame upper surface) of the frame 6. The frame 6 surrounds the periphery of the light-emitting element 3, and part of the lower surface of the frame 6 is located above the second upper surface 1b. The lower surface of the frame 6 may be disposed to cover the entirety of the region above the second upper surface 1b or may be disposed to cover a portion of the region above the second upper surface 1b. In particular, the lower surface of the frame 6 is preferably covered by the protective element 4 on the second upper surface 1b, which allows light from the light-emitting element 3 to be barely absorbed. The lower surface of the frame 6 in the first embodiment is a substantially flat surface.

The inner lateral surfaces of the cap 8, that is, inner lateral surfaces 6a of the frame 6 in the first embodiment, may be perpendicular to the substrate 1, but are preferably inclined with respect to the substrate 1. As shown in FIG. 2, with the inner lateral surfaces 6a of the frame 6 inclined outward from the substrate 1 side toward the light-transmissive member 7 side, light from the light-emitting element 3 can be efficiently reflected toward the light-transmissive member 7 above, so that the light extraction from the light-emitting element 3 can be improved. The inner lateral surfaces 6a of the frame 6 may be perpendicular to the substrate 1 or may have protrusions and depressions.

Further, with a reflective film 6b having a reflectance higher than the reflectance of the inner side surfaces 6a of the frame 6 is disposed on the inner side surfaces 6a, the light extraction from the light-emitting element 3 can be further improved. Examples of the reflective film 6b include metals such as Al and Ag. In the case where the reflective film 6b is made of a metal, the reflective film 6b can be formed by, for example, vapor deposition or sputtering. In the case where the frame 6 is formed of a material having a comparatively high reflectance, the reflective film 6b may not be disposed. This constitution can reduce the number of manufacturing steps.

The lower surface of the cap 8, that is, the lower surface of the frame 6 in the first embodiment, preferably has a low light reflectance. With this arrangement, light from the light-emitting element 3 is not easily emitted to the outside through the gap 9 between the substrate 1 and the frame 6. Accordingly, the light-emitting device 100 can be configured to emit light from the light-emitting element 3 through the upper surface of the light-emitting device 100, that is, through the light-transmissive member 7.

In the first embodiment, the frame 6 having a rectangular ring-like shape is bonded to the substrate 1 that has a rectangular shape in a plan view. In a plan view, the area surrounded by the outer periphery of the frame 6 in the first embodiment is smaller than the area surrounded by the outer periphery of the substrate 1, and the outer periphery of the frame 6 is located at an inner side of the outer periphery of the substrate 1. With this arrangement of the frame 6, the region in which the lower surface of the frame 6 is bonded to the upper surface of the substrate 1 can be increased compared with, for example, the case where the area surrounded by the outer periphery of the frame 6 is larger than the area surrounded by the outer periphery of the substrate 1 in a plan view, and thus the substrate 1 is not easily detached from the frame 6. The outer periphery of the frame 6 may coincide with the outer periphery of the substrate 1 in a plan view. The substrate 1 and the frame 6 may each have a rectangular shape in a plan view as shown in FIG. 10. In this case, inclination angles of inner lateral surfaces 6c of the frame 6 facing each other in the longitudinal direction may be the same as or may differ from inclination angles of inner lateral surfaces 6d of the frame 6 facing each other in the short-side direction. For example, light can be spread in the short-side direction of the light-emitting device in the case where the inclination angles of the inner lateral surfaces 6c of the frame 6 facing each other in the longitudinal direction are larger than the inclination angles of the inner lateral surfaces 6d of the frame 6 facing each other in the short direction. Accordingly, the above configuration is suitable for aligning the light-emitting devices in the short-side direction to form a linear light source.

A depression or a groove may be defined in the upper surface of the frame 6 so that the light-transmissive member 7 can be easily disposed and connected.

The light-transmissive member 7 is light-transmissive and is bonded to the upper surface of the frame 6 in the first embodiment. In the first embodiment, the frame 6 is bonded to the light-transmissive member 7 via the entirety of the bonding surface therebetween. With this arrangement, light reflected upward by the inner side surfaces 6a of the frame 6 is not easily emitted through between the frame 6 and the light-transmissive member 7, so that the light-emitting device 100 having desired light distribution can be obtained.

In the first embodiment, the outer periphery of the light-transmissive member 7 coincides with the outer periphery of the frame 6 in a plan view, as shown FIG. 1 to FIG. 3. This arrangement allows for easily maintaining the bondability between the frame 6 and the light-transmissive member 7, compared with, for example, the case where the outer periphery of the light-transmissive member 7 is on the outer side of the outer edge of the frame 6 in a plan view. The light-transmissive member 7 may have a shape of a convex lens instead of the flat plate shown in FIG. 2 and FIG. 3, or may have a depression, a groove, or the like on its surface.

The light-transmissive member 7 has a lower surface, which faces the light-emitting element 3 and the upper surface, which is opposite to the lower surface. A light-transmissive coating film that can reduce total reflection of light from the light-emitting element 3 can be disposed on one or both of the lower surface and the upper surface of the light-transmissive member 7. This arrangement allows for improving the light extraction from the light-emitting element 3. The coating film may be disposed entirely or partially on at least one of the upper surface and the lower surface. Examples of the coating film include an anti reflection (AR) coating. The coating film can be disposed by layering layers of materials having different refractive indices, such as $Al_2O_3$, $MgF_2$, Si, and $SiO_2$. For example, the coating film can be disposed on the entire upper surface and on the lower surface of the light-transmissive member 7 in the region except for the portion connected to the frame 6.

The cap 8 in which the frame 6 is bonded to the light-transmissive member 7 is used in the first embodiment, but a cap in which the frame is formed integrally with the light-transmissive member may be used.

The light-transmissive member 7, the adhesive members 5, the covering member, and the reflective film may each contain fluorescent materials, colorants, light-diffusion materials, fillers, or the like as desired.

In the light-emitting device 100 having the configurations above, a plurality of adhesive members 5 separately disposed along the outer periphery of the substrate 1 allows for providing the gap 9 between the upper surface of the substrate 1 and the lower surface of the frame 6 as shown in FIG. 3 and FIG. 7. The gap 9 penetrates from the space for mounting the light-emitting element 3 surrounded by the substrate 1 and the cap 8 to the outside of the light-emitting device 100. With such a gap 9 between the substrate 1, on which the light-emitting element 3 is disposed, and the frame 6, the gap 9 is likely to be located closer to the light-emitting element 3 than, for example, in the case where the gap 9 is defined between the frame 6 and the light-transmissive member 7. Thus, air outside the light-emitting device 100 easily gets contact with the light-emitting element 3, so that deposits that adhere to the surface of the light-emitting element 3 are more effectively reduced.

The protective element 4 is mounted on the second upper surface 1b so that the upper surface of the protective element 4 is located at the same height as or lower than the first upper surface 1a. Accordingly, the protective element 4 does not block the path between the light-emitting element 3 and the gap 9, so that air can easily flow in and out of the space for mounting the light-emitting element 3 from and to the outside in this structure. This arrangement allows for preventing adhesion of black deposits to the surface of the light-emitting element 3 during operation of the light-emitting device 100, so that a light-emitting device 100 with high reliability can be provided in which light extraction from the light-emitting element 3 due to deposits is not easily decreased.

Members constituting the light-emitting device 100 in the first embodiment will be described below in detail.

Substrate

For example, the substrate 1 includes the positive and negative wirings 2a and an insulating base member 2b supporting the wirings, as shown in FIG. 2. The positive and negative wirings 2a and the base member 2b are preferably made of materials that can reflect light emitted from the light-emitting element 3 mounted on their upper surfaces.

The positive and negative wirings 2a can be made of any appropriate material that is known in the field of the invention and can be electrically connected to the light-emitting element 3. For example, Cu, Ni, Pd, W, Cr, Ti, Al, Ag, Au, or an alloy of one or more of these metals can be used. In view of the heat dissipation performance, Cu or a Cu alloy is particularly preferable for the positive and negative wirings 2a. A coating of Ag, Pt, Sn, Au, Cu, Rd, an alloy of these metals, or an oxide may be formed on the surfaces of the positive and negative wirings 2a. The positive and negative wirings 2a may be formed by plating, sputtering, or another known method, or lead frames or the like may be used.

Examples of the material of the base member 2b include insulating materials such as ceramics, resins, and glass. In particular, ceramics, which are inorganic materials, are preferable in view of the heat dissipation performance. Among ceramics, AlN, which has a high heat dissipation performance, is particularly preferable.

Materials known in the field of the invention can be used for an electrically-conductive adhesive or an insulating adhesive for connecting the light-emitting element 3 and the protective element 4 to the substrate 1 as appropriate. Examples of the electrically-conductive adhesive include Au—Sn solder.

Light-Emitting Element

The light-emitting element 3 is a light-emitting diode or a laser diode generally used in the field of the invention. For example, various semiconductors such as nitride based semiconductors ($In_XAl_YGa_{1-X-Y}N$, $0 \leq X$, $0 \leq Y$, $X+Y \leq 1$) and groups III-V compound semiconductors including GaP and GaAs can be used. The light-emitting element 3 includes at least semiconductor layers including a light-emitting layer, and the positive and negative electrodes. The positive and negative electrodes of the light-emitting element 3 according to the first embodiment are disposed on the same surface side of the light-emitting element 3. With this arrangement, the light-emitting element 3 can be flip-ship mounted on the substrate 1, and the size of the light-emitting device 100 can be reduced compared with the case where the light-emitting element 3 is electrically connected to the substrate 1 via wires. In addition, in the case of performing flip-chip mounting, wires and their bonding portions of the wires may not be formed between the light-emitting element 3 and the gap 9. Thus, the flow of air between the space for mounting the light-emitting element 3 and the outside of the light-emitting device 100 tends to be smooth.

A surface of the light-emitting element 3 opposite to a surface on which the electrodes are disposed may be bonded to the first upper surface 1a of the substrate 1, and the positive and negative electrodes of the light-emitting element 3 may be electrically connected to the positive and negative wirings 2a of the substrate 1, respectively, via wires. Alternatively, a light-emitting element may be used in which one of the positive and negative electrodes is disposed on the upper surface of the light-emitting element and the other electrode is disposed on the lower surface thereof.

The light-emitting element 3 in the first embodiment is configured to emit ultraviolet light. In the present specification, "ultraviolet light" refers to light having emission wavelength in a range of 10 nm to 400 nm, more preferably 10 nm to 380 nm. Using the light-emitting element 3 to emit light with such comparatively strong energy may cause adhesion of black deposits on the surface of the light-emitting element 3 during operation of the light-emitting device 100. This may be significantly observed particularly in the case where the light-emitting element 3 to emit light having emission wavelengths in the range of 200 nm to 380 nm, which is referred to as near-ultraviolet range, is used. Adhesion of the deposits can be prevented, however, with a structure in which the flow of air between the space for mounting the light-emitting element 3 and the outside is smooth, as in the light-emitting device 100 in the first embodiment. The light-emitting device 100 to emit desired light with high reliability can be thus provided.

For example, metals such as Au, Ag, Cu, Pt, Al, Rh, W, Ti, Ni, or Pd can be used for a material of the electrodes of the light-emitting element 3 as a single layer or a layered structure in which one or more of these metals are layered.

The light-emitting element 3 may include a growth substrate for growing a semiconductor layer. Examples of the growth substrate include insulating substrates such as sapphire, SiC, ZnO, Si, GaAs, diamond, and oxide substrates such as lithium niobate and neodymium gallate. The growth substrate is preferably light-transmissive. The growth substrate may be removed by laser lift-off or the like.

Protective Element

Examples of the protective element 4 include Zener diodes, capacitors, and varistors. In particular, with a Zener diode mounted as the protective element 4, the light-emitting device 100 with high reliability during operation can be provided. The protective element 4 may be flip-chip mounted on or may be electrically connected via wires or the like to the positive and negative wirings 2a on the second upper surface 1b of the substrate 1. As shown in FIG. 2 and FIG. 3, flip-chip mounting of the protective element 4 on the second upper surface 1b of the substrate 1 allows for miniaturizing the light-emitting device. In addition, in the case of performing flip-chip mounting, wires or the like for electrically connecting the protective element 4 to the positive and negative wirings 2a of the substrate 1 may not be disposed, so that the flow of air between the space for mounting the light-emitting element 3 and the outside is not easily blocked.

Adhesive Material

Any appropriate materials that can bond the substrate 1 to the cap 8 may be used for the adhesive members 5. Examples of the materials of the adhesive members 5 include resins, solder, and low-melting-point glass. In particular, a resin can be easily disposed on the upper surface 1a of the substrate 1, and thus is preferable. Examples of such a resin include a silicone resin and an epoxy resin. In particular, a silicone resin is preferable in view of heat resistance. Examples of the material of a solder include Au—Sn and Au—In. A solder is not easily deteriorated by light from the light-emitting element 3. Also, with a solder, misalignment between the cap 8 and the substrate 1 at the time of bonding can be corrected due to self-alignment effect.

The adhesive members 5 can be disposed by potting, printing, or the like. In particular, potting is preferable in view of manufacturing cost and operation efficiency.

Cap

The cap 8 is a separated from the substrate 1 and is bonded to the substrate 1 via the adhesive members 5. In the first embodiment, the cap 8 includes the frame 6 and the light-transmissive member 7.

Frame

For the frame 6, any appropriate material that can block light from the light-emitting element 3 and can be bonded to the substrate 1 and the light-transmissive member 7 can be used. Examples of an inorganic material for the frame 6 include nonmetals such as Si and metals such as Al, Co, W, Fe—Ni alloys, Pt, Cu, and Cu—W. Examples of an organic material for the frame 6 include resins such as polyamide resins, polyphthalamide resin, and glass epoxy resin.

The frame 6 is preferably made of a material that can be easily shaped into a desired shape. Examples of a material that can be easily shaped include Si. Examples of the method for shaping the frame 6 include cleaving, etching, and molding in which a mold is used. Si allows the inner side surfaces 6a of the frame 6 to be easily shaped into desired inclined surfaces, and thus is particularly preferable. More specifically, Si has a crystal structure that allows a smooth cleavage plane inclined at 54.7° to be obtained by cleaving. Using such cleavage plane as the inner side surfaces 6a of the frame 6 allows for facilitating to shape the frame 6 that can efficiently reflect light from the light-emitting element 3 toward the light-transmissive member 7.

The frame 6 is preferably made of a material that can be easily bonded to the light-transmissive member 7. For example, in the case where the light-transmissive member 7 is made of glass and the frame 6 is made of Si, the frame 6 can be anodically bonded to the light-transmissive member 7. With anodic bonding, members can be firmly bonded by applying heat and voltage. Further, the frame 6 is preferably made of a material having a high reflectance. With this arrangement, heat can be efficiently reflected from the light-emitting element 3 toward the light-transmissive member 7. Examples of the material having a high reflectance include Al and Ag.

Further, the frame 6 is preferably made of a material having a thermal expansion coefficient close to the thermal expansion coefficient of the substrate 1. This configuration allows for reducing fracturing or breakage due to thermal expansion of members at the time of bonding the substrate 1 to the frame 6.

Light-Transmissive Member

The light-transmissive member 7 is preferably made of, for example, glass, which is not easily deteriorated. In addition, resins such as epoxy resin, silicone resin, polyamide resin, polypropylene resin, acrylic resin, or polycarbonate resin, or quartz can be used for the light-transmissive member 7. The light-transmissive member 7 is preferably transparent but may be nontransparent such as opaque. The light-transmissive member 7 is preferably made of a material having a small thermal expansion coefficient. The light-transmissive member 7 is preferably made of a material having a smaller difference in thermal expansion coefficient from the substrate 1 and the frame 6. This arrangement allows for reducing breakage of the light-transmissive member 7.

In the case where the emission wavelength of the light-emitting element 3 is in the near-ultraviolet to ultraviolet range of 400 nm or less, glass is preferably used for the material of the light-transmissive member 7. This allows for decreasing deterioration compared with the case where a resin or the like is used. In the case where the emission wavelength of the light-emitting element 3 is in the deep ultraviolet range of 250 nm or less, quartz is preferably used. With this, light from the light-emitting element 3 can be efficiently extracted.

Second Embodiment

Figure 5A:
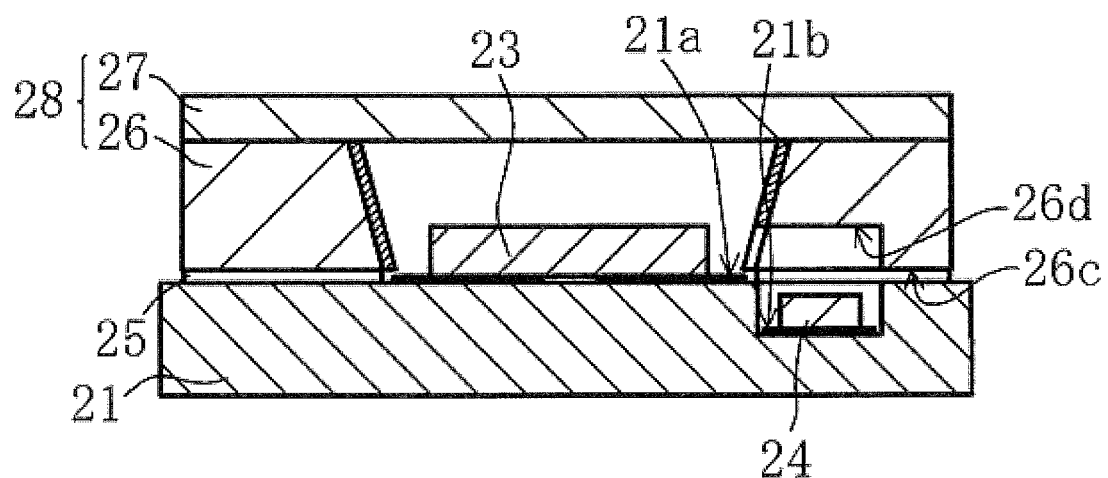
FIG. 5A is a schematic cross-sectional view of a light-emitting device according to a second embodiment.

FIG. 5A is a schematic cross-sectional view of a light-emitting device 200a according to a second embodiment. The frame 6 having the approximately flat lower surface is used in the first embodiment, but a frame having a depression in the lower surface may be used. In the second embodiment, a lower surface of a frame 26 includes a first lower surface portion 26c above the upper surface side of a substrate 21, and a second lower surface 26d portion located higher than the first lower surface portion 26c, as shown in FIG. 5A. The second lower surface 26d can be located higher than the first lower surface 26c by 0.1 mm to 0.3 mm. Other configurations of the light-emitting device can be substantially the same as that in the first embodiment, and thus detailed description thereof is omitted.

With the second lower surface portion 26d as described above, the light-emitting device 200a can be produced in which an adhesive, flux or the like does not easily enter inner side of the frame 26 at the time of mounting on the mounting board, while reducing the narrow gap between a first upper surface 21a of the substrate 21 and the lower surface of the frame 26. Thus, malfunction of a light-emitting element 23 and a protective element 24 due to entry of an adhesive, flux, or the like can be prevented while smoothening the flow of air between a space for mounting the light-emitting element 23 and the outside of the light-emitting device 200a, and light-emitting device 200a with high reliability can be provided.

The second lower surface 26d is preferably provided at least above a second upper surface 21a of the substrate 21. A portion of the air flowing between the space for mounting the light-emitting element 23 and the outside of the light-emitting device 200a advances along the first upper surface 21a and then along the second upper surface 21b of the substrate 21. The strength of air flow along the second upper surface 21b may be reduced due to difference between the height of the first upper surface 21a and the height of the second upper surface 21b. However, with the second lower surface 26d of the frame 26 above the second upper surface 21b of the substrate 21, which widens corresponding portion of the gap between the substrate 21 and the frame 26, the flow of the air can be activated.

Figure 5B:
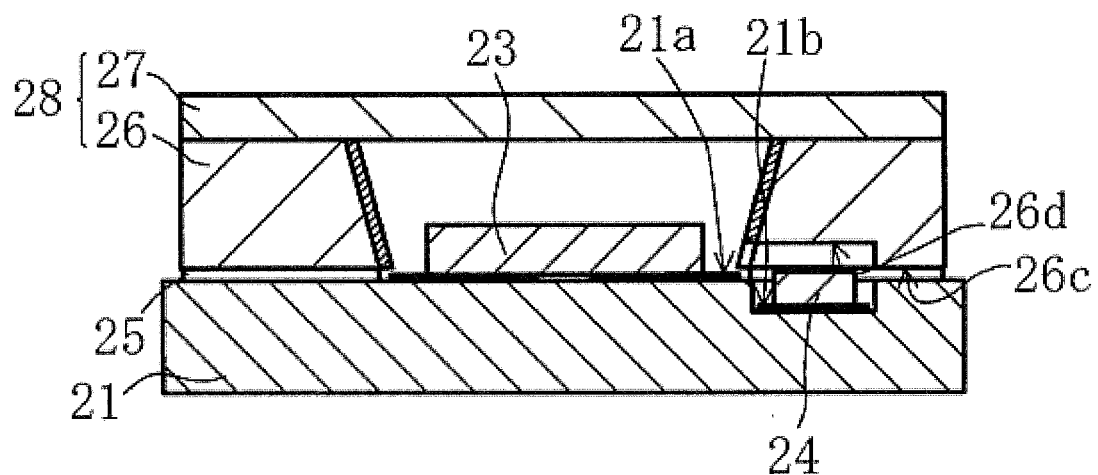
FIG. 5B is a schematic cross-sectional view of a light-emitting device according to another form of the second embodiment.

FIG. 5B is a schematic cross-sectional view of a light-emitting device 200b according to another form of the second embodiment. With the frame 26 having the lower surface that includes the first lower surface 26c and the second lower surface 26d, as in the second embodiment, a sufficient gap between the protective element 24 and the frame 26 can be ensured even in the case where the protective element 24 having an upper surface located higher than the first upper surface 21a of the substrate 21 is used. With this structure, the flow of air between the space for mounting the light-emitting element 23 and the outside of the light-emitting device 200b can be comparatively smooth.

In the second embodiment, the reflective film may be disposed not only on the inner lateral surfaces of the frame 26 but on the first lower surface 26c, the second lower surface 26d, and the lateral surfaces of the depression in the lower surface. This arrangement allows for further improving the light extraction from the light-emitting element 3.

Third Embodiment

Figure 6:
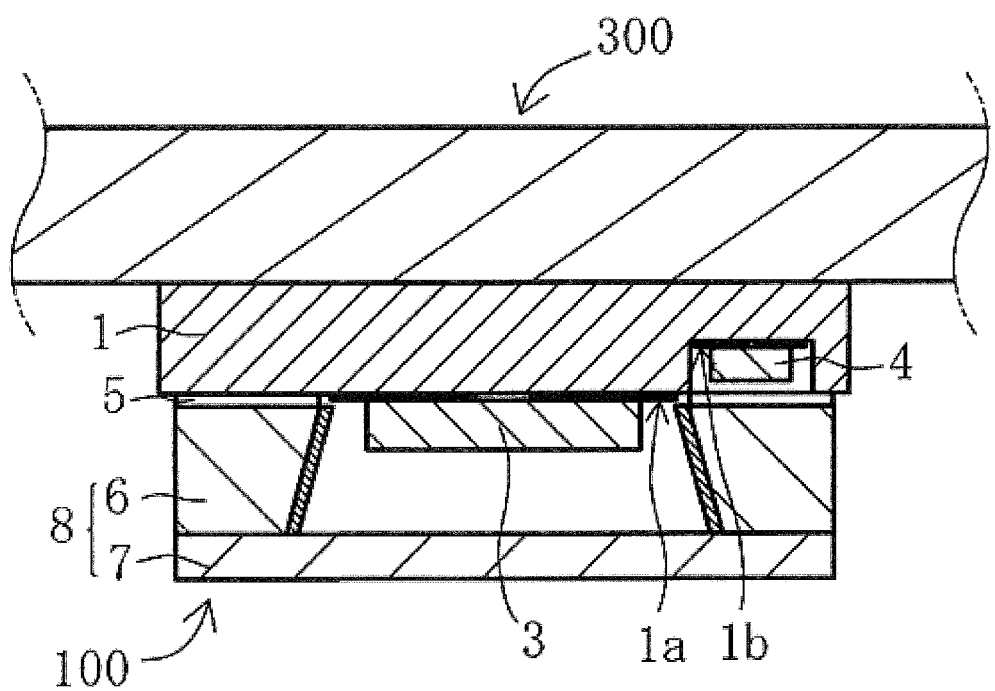
FIG. 6 is a schematic cross-sectional view of a part of a light-emitting module in which the light-emitting device according to the first embodiment is mounted on a mounting board.

FIG. 6 is a schematic cross-sectional view of a portion of a light-emitting module 1000 in which the light-emitting device 100 is mounted on a mounting board 300. The light-emitting module 1000 is used in a state in which the light-emitting device 100 is bonded to the mounting board 300 so that the substrate 1 of the light-emitting device 100 is disposed on an upper side.

Mounting the light-emitting device 100 so that the substrate 1 is disposed on the upper side to be used as the light-emitting module 1000 as described above allows for further activating movement of air in and out between the space for mounting the light-emitting element 3 and the outside of the light-emitting device 100. More specifically, the air in the space for mounting the light-emitting element 3 of the light-emitting device 100 is warmed by light and heat emitted from the light-emitting element 3, and tends to move toward the upper side of the space, that is, substrate 1 side of the light-emitting device 100 shown in FIG. 6 in the embodiment 3. With the gap between the substrate 1 and the frame 6 of the light-emitting device 100 defined in the space for mounting the light-emitting element 3 in a region in which the air tends to gather, the flow of air in and out of the light-emitting device 100 tends to be smooth if. Accordingly, adhesion of the deposits to the surface of the light-emitting element 3 can be thus efficiently prevented, and the reliable light-emitting module 1000 can be provided.

Fourth Embodiment

Figure 8A:
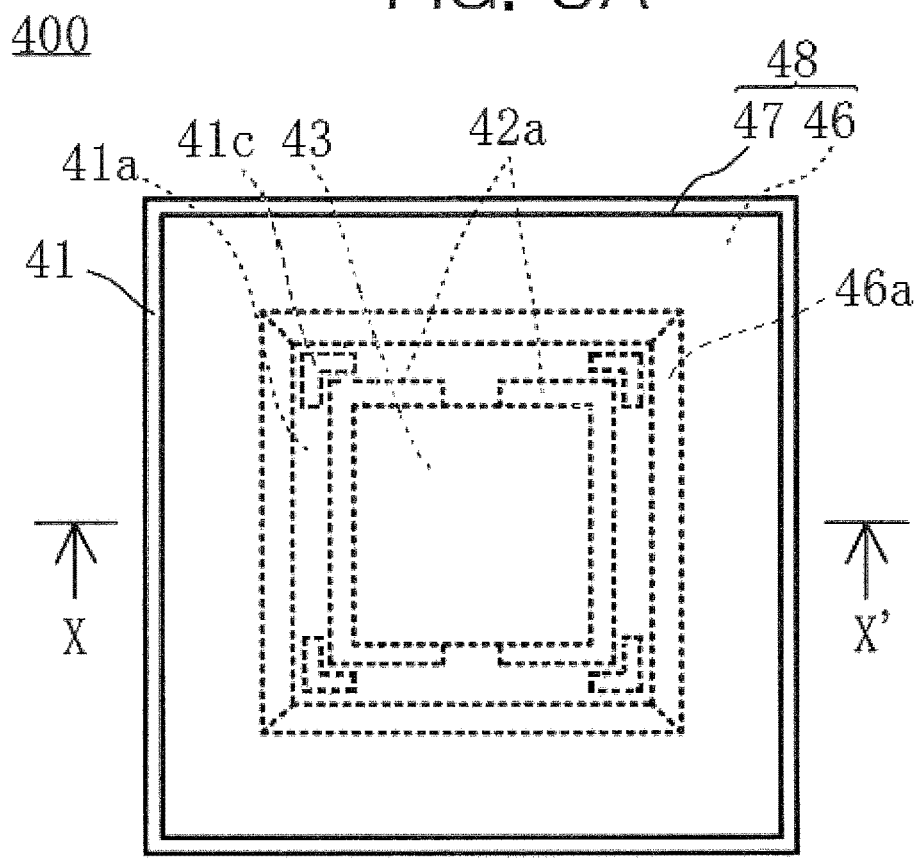
FIG. 8A is a schematic plan view of a light-emitting device according to a fourth embodiment of the present invention.
Figure 8B:
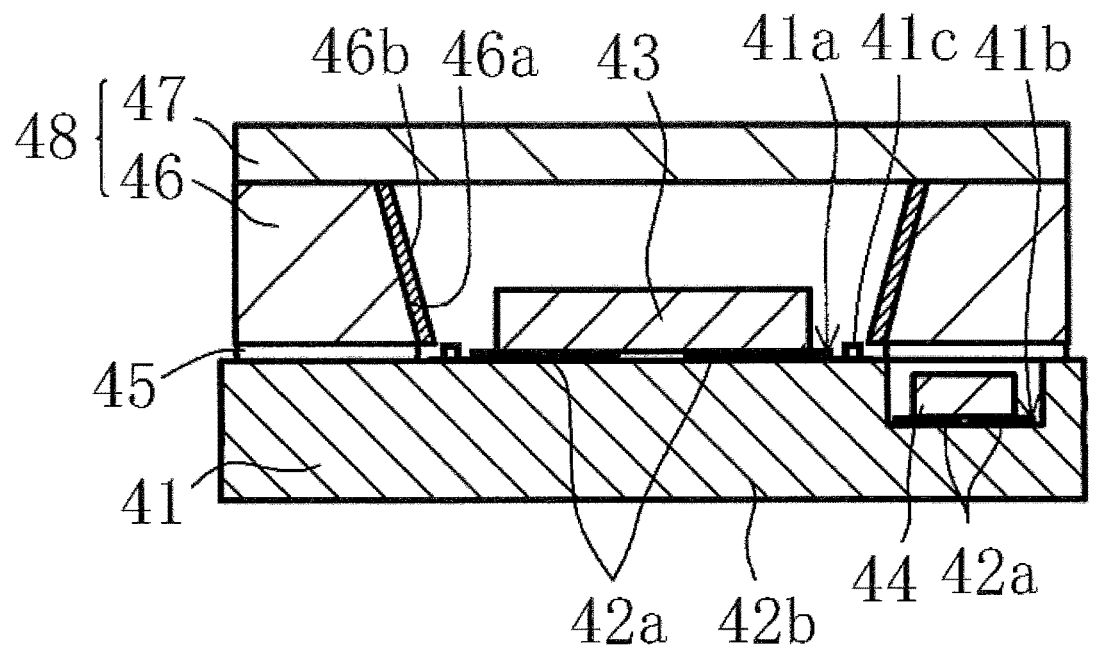
FIG. 8B is a schematic cross-sectional view of the light-emitting device in FIG. 8A taken along the line X-X'.
Figure 8C:
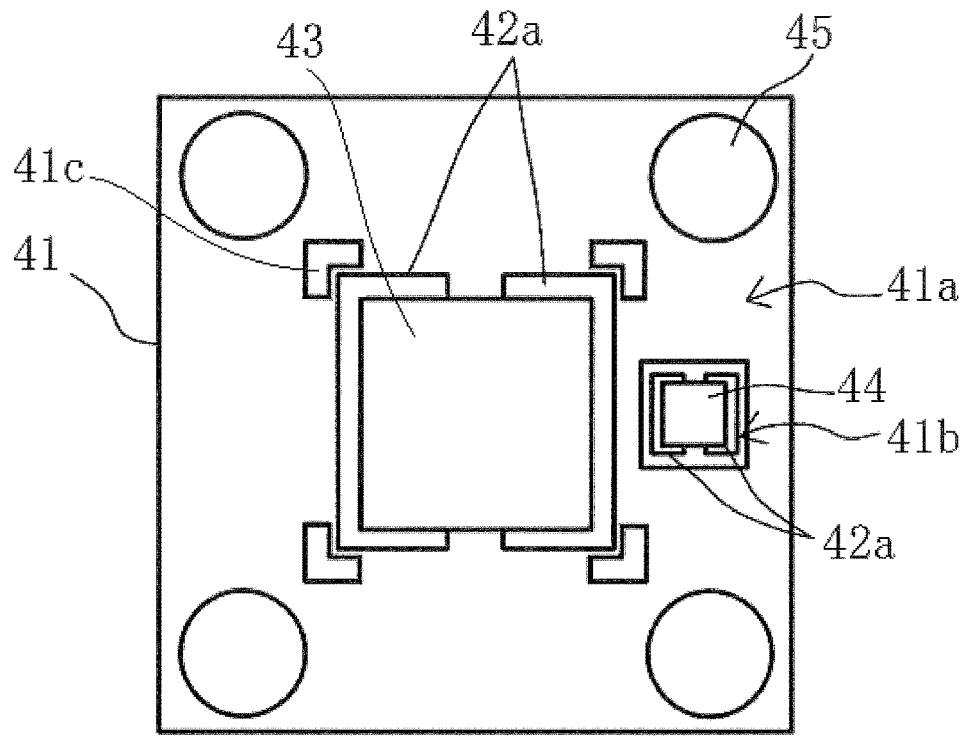
FIG. 8C is a schematic plan view of a substrate on which a light-emitting element, a protective element, and adhesive materials are disposed and that is used for the light-emitting device in FIG. 8A, showing a state before a cap including a frame and a light-transmissive member is bonded to the substrate.

FIG. 8A is a schematic plan view of a light-emitting device 400 according to a fourth embodiment. FIG. 8B is a schematic cross-sectional view of the light-emitting device 400 in FIG. 8A taken along the line X-X'. FIG. 8C is a schematic plan view of a substrate 41 on which a light-emitting element 43, a protective element 44, and adhesive members 45 are disposed and that is used for the light-emitting device 400, showing a state before a cap 48 including a frame 46 and a light-transmissive member 47 is bonded to the substrate 41. In the light-emitting device 400, the first upper surface of the substrate 41 has projections 41c in regions on imaginal lines connecting between the light-emitting element 43 and the adhesive members 45 in a plan view. In the light-emitting device 400, a plurality of projections 41c is disposed each corresponding to respective one of a plurality of adhesive materials 45. The projections 41c can reflect light from the light-emitting element 43 upward, which allows for preventing deterioration of the adhesives 45 caused by direct irradiation of the adhesive materials 45 with light emitted from the light-emitting element 43 while preventing decrease in the light extraction efficiency. Other configurations of the light-emitting device can be substantially the same as the constitution in the first embodiment, and thus its detailed description is omitted.

The projections 41c are disposed along inner side surfaces 46a of the frame 46 at the inner side of the frame 46 in a plan view. With a plurality of projections 41c spaced from one another in a plan view, the gap penetrating from a space for mounting the light-emitting element 43 to the outside of the light-emitting device 400 is secured even if the projections 41c have contact with the frame 46.

The upper surfaces of the projections 41c are preferably located at the same height as or higher than the lower surface of the frame 46. With this arrangement, the adhesive members 45 is less likely to be directly irradiated with light emitted from the light-emitting element 43.

Fifth Embodiment

Figure 9A:
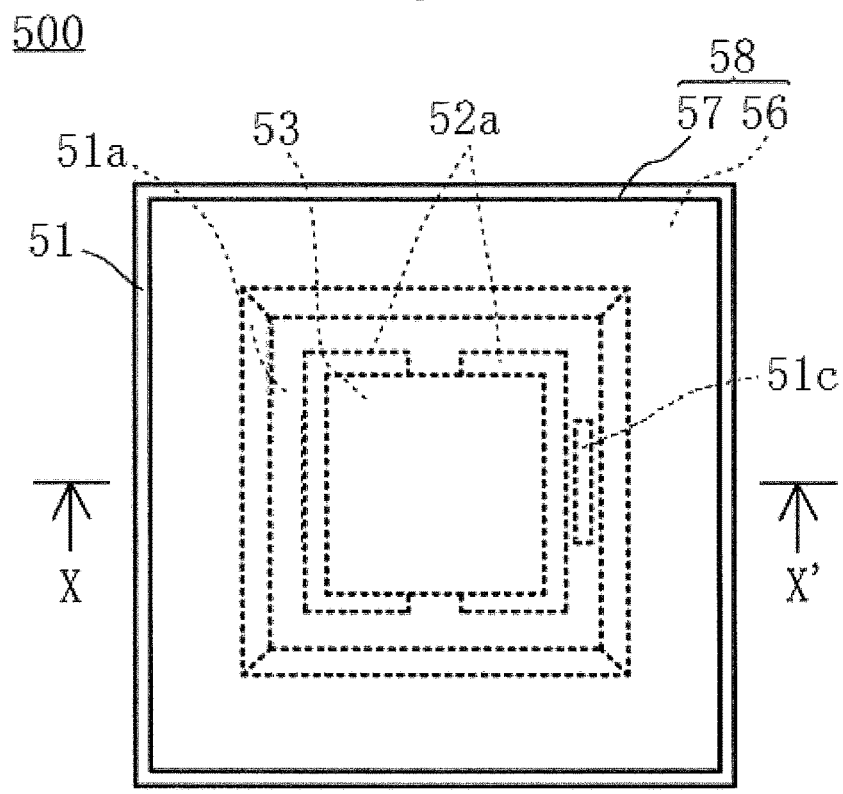
FIG. 9A is a schematic plan view of a light-emitting device according to a fifth embodiment of the present invention.
Figure 9B:
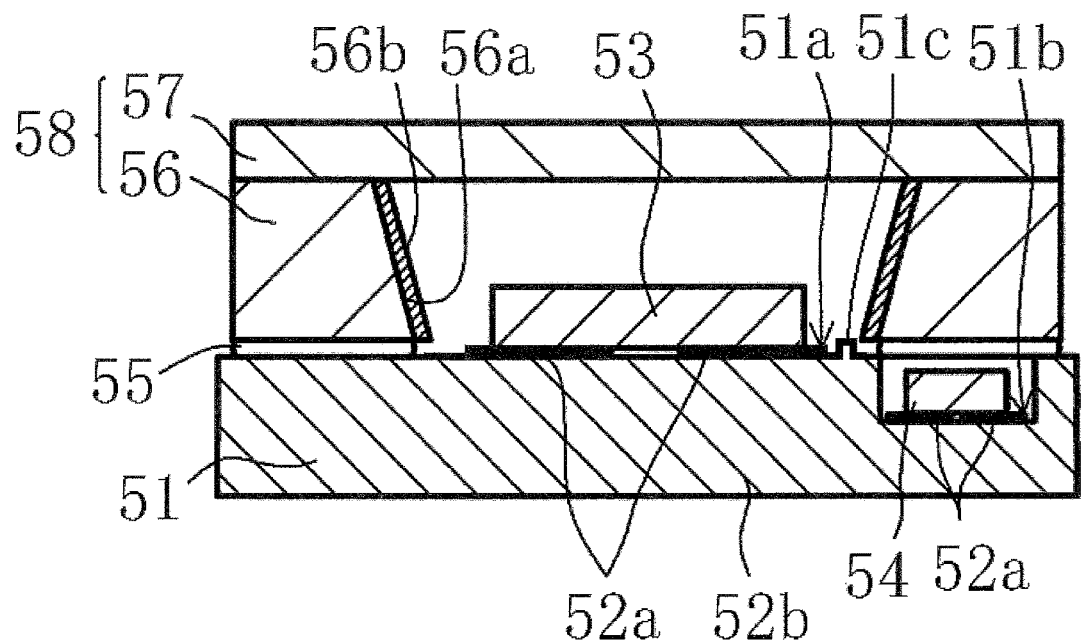
FIG. 9B is a schematic cross-sectional view of the light-emitting device in FIG. 9A taken along the line X-X'.
Figure 9C:
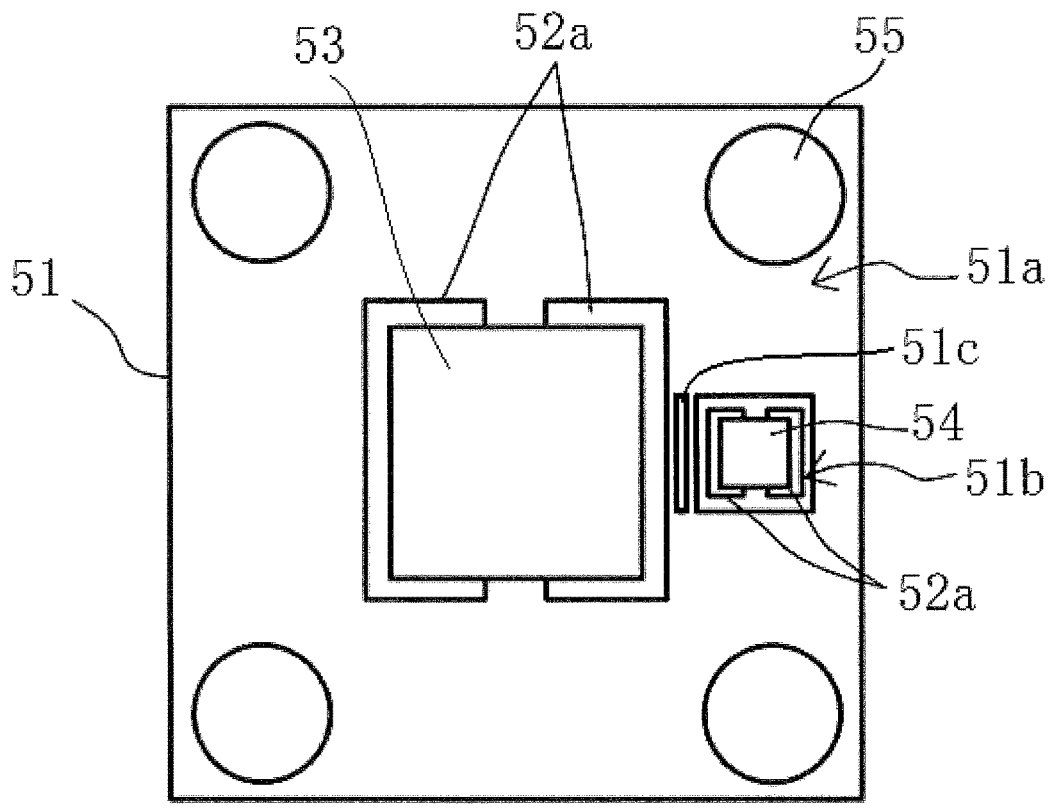
FIG. 9C is a schematic plan view of a substrate on which a light-emitting element, a protective element, and adhesive materials are disposed and that is used for the light-emitting device in FIG. 9A, showing a state before a cap including a frame and a light-transmissive member is bonded to the substrate.

FIG. 9A is a schematic plan view of a light-emitting device 500 according to a fifth embodiment. FIG. 9B is a schematic cross-sectional view of the light-emitting device 500 in FIG. 9A taken along the line X-X'. FIG. 9C is a schematic plan view of a substrate 51 on which a light-emitting element 53, a protective element 54, and adhesive members 55 are disposed and that is used for the light-emitting device 500 in FIG. 9A, showing a state before a cap 58 including a frame 56 and a light-transmissive member 57 is bonded to the substrate 51. In the light-emitting device 500, an upper surface of the substrate 51 has a projection 51c in a region between the light-emitting element 53 and the protective element 54 in a plan view. Other configurations of the constitution of the light-emitting device can be substantially the same as the constitution in the first embodiment, and thus its detailed description is omitted.

With the projection 51c, absorption of light emitted from the light-emitting element 53 by the protective element 54 can be reduced. The upper surface of the projection 51c is preferably located at the same height as or higher than the lower surface of the frame 56. With this arrangement, the protective element 55 less likely to be directly irradiated with light emitted from the light-emitting element 53. Also in the light-emitting device 400 according to the fourth embodiment, a projection corresponding to the projection 51c in the present embodiment can be disposed.

An example of the light-emitting device 100 according to the first embodiment will be described below in detail based on the accompanying drawings.

Example 1

The dimension of a light-emitting device 100 in Example 1 is 3.5 mm×3.5 mm in a plan view and 0.9 mm in thickness in the height direction. The light-emitting device 100 in Example 1 includes a substrate 1 including a base member 2b made of AlN and positive and negative wirings 2a made of Ni/Au. The substrate 1 in Example 1 has a rectangular shape of 3.5 mm×3.5 mm in a plan view and a thickness of 0.4 mm in the height direction. The upper surface of the substrate 1 includes a first upper surface 1a and a second upper surface 1a located lower than the first upper surface 1b. The positive and negative wirings 2a are disposed on each of the first upper surface 1a and the second upper surface 1b.

The second upper surface 1b in Example 1 is located lower than the first upper surface 1a by 0.2 mm. In a plan view, for example, the second upper surface 1b is disposed offset to one of the sides of the rectangular shape of the substrate 1 from the approximate center of the rectangular of the upper surface of the substrate 1, and has a rectangular shape measuring 0.7 mm×0.7 mm.

A light-emitting element 3 in Example 1 includes positive and negative electrodes on the same surface, has a rectangular shape measuring 1.0 mm×1.0 mm in a plan view, and has a thickness of 0.2 mm in the height direction. The light-emitting element 3 is flip-chip mounted on the first upper surface 1a (for example, at the approximate center) of the substrate 1 in a plan view via an electrically-conductive adhesive. In Example 1, an element having positive and negative electrodes on the same surface, having a rectangular shape of 0.43 mm×0.35 mm in a plan view, and having a thickness of 0.14 mm in the height direction can be used for a protective element 4. The protective element 4 is flip-chip mounted on the second upper surface 1b of the substrate 1 via an electrically-conductive adhesive, and the upper surface of the protective element 4 is located at the same height as or lower than the first upper surface 1a.

In Example 1, a silicone resin is disposed as adhesive members 5 respectively on the corner portions of the first upper surface 1a of the rectangular substrate 1 in a plan view. For example, for the adhesive members 5, a silicone resin having a viscosity of 80 Pa·S to 150 Pa·S can be disposed on the four corners of the substrate 1 to each have the diameter of 0.37 mm.

In a cap 8 in Example 1, a rectangular glass plate, that serve as a light-transmissive member 7, is anodically bonded to the upper surface of a frame 6 made of Si having a rectangular annular shape in a plan view. The outer periphery of the frame 6 approximately coincides with the outer periphery of the light-transmissive member 7 in a plan view. In Example 1, the frame 6 has a thickness of 0.3 mm in the height direction and 1.1 mm in the width direction, and the light-transmissive member 6 has a thickness of 0.2 mm in the height direction. In Example 1, the outer periphery of the cap 8 is located at 0.05 mm to 0.2 mm inner side of the outer periphery of the substrate 1 in a plan view. Inner lateral surfaces 6a of the frame 6 in Example 1 are inclined outward from the substrate 1 side toward the light-transmissive member 7 side, and Al can be disposed in a thickness of 1

µm to 5 µm as a reflective film 6b on these inclined surfaces. In Example 1, an AR coating layer made of Al$_2$O$_3$ and MgF$_2$, which serves as a coating film, is disposed on the upper surface and on the lower surface in the region except for the surface bonded to the frame 6 of the light-transmissive member 7.

In Example 1, a gap 9 between the first upper surface 1a of the substrate 1 and the lower surface of the frame 6 has a length of 30 µm in the height direction. The gap 9 penetrates from a space for mounting the light-emitting element 3 to the outside of the light-emitting device 100 between the adhesive members 5, and members such as the protective element 4 and wires are not disposed between the light-emitting element 3 and the gap 9, as shown in FIG. 3 and FIG. 7. This arrangement allows for providing the light-emitting device 100 with high reliability in which moving of air in and out between the space for mounting the light-emitting element 3 and the outside of the light-emitting device 100 is comparatively smooth and black deposits are not easily adhered to surfaces of the light-emitting element 3.

Obviously, numerous modifications and variations of the present invention are possible in light of the above teachings. It is therefore to be understood that within the scope of the appended claims, the invention may be practiced otherwise than as specifically described herein.

What is claimed is:

1. A light-emitting device comprising:
    a substrate comprising:
        a substrate bottom surface;
        a substrate first upper surface opposite to the substrate bottom surface in a height direction of the light-emitting device; and
        a substrate second upper surface opposite to the substrate bottom surface in the height direction, the substrate second upper surface being provided between the substrate first upper surface and the substrate bottom surface in the height direction;
    a light-emitting element to emit ultraviolet light provided on the substrate first upper surface;
    a protective element provided on the substrate second upper surface, the protective element comprising:
        a protective element lower surface facing the substrate second upper surface; and
        a protective element upper surface opposite to the protective element lower surface in the height direction, the protective element upper surface being provided between the substrate first upper surface and the substrate second upper surface in the height direction;
    adhesive members provided on the substrate first upper surface to surround the light-emitting element;
    a frame bonded to the substrate first upper surface via the adhesive members to surround the light-emitting element, the frame overlapping with the protective element in the height direction, the frame comprising:
        a frame lower surface being opposite to the substrate first upper surface and the substrate second upper surface in the height direction to provide a gap between the substrate first upper surface and the frame lower surface such that the gap does not overlap with the adhesive members when viewed in the height direction, a space in which the light-emitting element is provided communicating with an outside of the space via the gap; and
        a frame upper surface opposite to the frame lower surface in the height direction; and
    a light-transmissive member provided on the frame upper surface.

2. The light-emitting device according to claim 1, wherein the gap between the substrate first upper surface and the frame lower surface has a length of 10 µm to 50 µm in the height direction.

3. The light-emitting device according to claim 1, wherein the frame lower surface has a recess in a region facing the substrate second upper surface.

4. The light-emitting device according to claim 1,
    wherein the substrate has a rectangular shape viewed in the height direction,
    wherein the adhesive members are provided on corners of the substrate first upper surface viewed in the height direction, and
    wherein the adhesive members are separated from each other.

5. The light-emitting device according to claim 1, wherein the light-emitting element is flip-chip mounted on the substrate.

6. The light-emitting device according to claim 1, wherein the protective element is flip-chip mounted on the substrate.

7. The light-emitting device according to claim 1, wherein a reflective film is provided on an inner lateral surface of the frame, the inner lateral surface connecting the frame upper surface and the frame lower surface and facing the light-emitting element.

8. The light-emitting device according to claim 1, wherein the substrate comprises at least one first projection between the light-emitting element and at least one of the adhesive members on the substrate first upper surface.

9. The light-emitting device according to claim 8,
    wherein the at least one first projection comprises first projections each provided between the light-emitting element and each of the adhesive members, and
    wherein the first projections are separated from one another viewed in the height direction.

10. The light-emitting device according to claim 1, wherein the substrate comprises a second projection between the light-emitting element and the protective element on the substrate first upper surface.

* * * * *